United States Patent
Yoon

(10) Patent No.: US 7,825,712 B2
(45) Date of Patent: Nov. 2, 2010

(54) MULTI-PHASE CLOCK SIGNAL GENERATING CIRCUIT HAVING IMPROVED PHASE DIFFERENCE AND A CONTROLLING METHOD THEREOF

(75) Inventor: Dae Kun Yoon, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 36 days.

(21) Appl. No.: 12/407,508

(22) Filed: Mar. 19, 2009

(65) Prior Publication Data

US 2010/0148842 A1 Jun. 17, 2010

(30) Foreign Application Priority Data

Dec. 11, 2008 (KR) .................. 10-2008-0125678

(51) Int. Cl.
*H03H 11/16* (2006.01)
(52) U.S. Cl. ...................... 327/237; 327/258
(58) Field of Classification Search .............. None
See application file for complete search history.

(56) References Cited

U.S. PATENT DOCUMENTS 6,570,425 B2 * 5/2003 Yamaguchi ............. 327/251
7,495,481 B2 * 2/2009 Kodama ................. 327/105
2003/0210758 A1 * 11/2003 Lee et al. ................ 375/371
2005/0053180 A1 3/2005 Nose et al.
2008/0129362 A1 6/2008 Kawai

FOREIGN PATENT DOCUMENTS

JP 2008-124714 A 5/2008

* cited by examiner

*Primary Examiner*—Cassandra Cox
(74) *Attorney, Agent, or Firm*—Ladas & Parry LLP

(57) ABSTRACT

A multi-phase clock signal generating circuit includes a phase correction block configured to receive multi-phase clock signals and produce a plurality of interpolated phase clock signal groups in which the phases of the multi-phase clock signals are differently controlled. The multi-phase clock signals are out of phase with each other. A clock control block is configured to produce output multi-clock signals by selectively outputting one among the interpolated phase clock signal groups using a digital control signal having a plurality of bits which are produced based on phase differences of the multi-phase clock signals.

17 Claims, 5 Drawing Sheets

MULTI-PHASE CLOCK SIGNAL GENERATING CIRCUIT HAVING IMPROVED PHASE DIFFERENCE AND A CONTROLLING METHOD THEREOF

CROSS-REFERENCES TO RELATED APPLICATION

The present application claims priority under 35 U.S.C. 119(a) to Korean application number 10-2008-0125678, filed on Dec. 11, 2008, in the Korean Patent Office, which is incorporated by reference in its entirety as if set forth in full.

BACKGROUND OF THE INVENTION

1. Technical Field

Embodiments disclosed herein relate generally to a multi-phase clock generating circuit and a method for controlling the same, and more particularly to a multi-phase clock generating circuit capable of improving a phase difference and a method for controlling the same.

2. Related Art

As technologies of memory systems continue to develop, the demand for high-speed data processing increases and high-speed data transmission rate in semiconductor memory devices is required. A prefetch scheme is applied to an internal circuit of a semiconductor memory device to satisfy the high-speed data transmission rate or high-bandwidth of the data which are input serially from an external circuit. In the prefetch the serial data are parallelized by latch circuits. The prefetch is achieved in the semiconductor memory device by using multi-phase clock signals that are out of phase with each other.

Multi-phase clock signals can be generated, for example, by a Phase Locked Loop (PLL) circuit or a Delay Locked Loop (DLL) circuit. However, feedback loop circuits, including the PLL and the DLL, require a large area and consume a large current, and as such, feedback loop circuits are not suitable for a low-power operating circuit. As an alternative, phase interpolators are widely used to generate clock signals based on the phase-difference interpolation, using two clock signals supplied from an external circuit.

In more detail, the phase interpolators generate new clock signals, each of which has a center phase between the two input clock signals from the external circuit. However, as the frequency of the clock signal increases, positioning the center phase exactly at the center between the two input clock signals becomes increasingly difficult, and therefore, problematic. Accordingly, as the frequency of the clock signal increases, a phase offset can be caused every clock signal of the multi-phase resulting in an error in the phase. Furthermore, when the data are transmitted in synchronization with the multi-phase clock signal, the actual valid window of the data is reduced. Therefore, a circuit for generating multi-phase clock signals with reduced current consumption and without an error is needed.

SUMMARY

A multi-phase clock generating circuit capable of improving a phase error is described herein.

A method for controlling a multi-phase clock generating circuit capable to improve a phase error is described herein.

According to one aspect, a multi-phase clock signal generating circuit comprises a phase correction block configured to receive multi-phase clock signals, which are out of phase with each other, and produce a plurality of interpolated phase clock signal groups in which the phases of the multi-phase clock signals are differently controlled, and a clock control block configured to produce output multi-clock signals by selectively outputting one of the interpolated phase clock signal groups using a digital control signal having a plurality of bits which are produced based on phase differences of the multi-phase clock signals.

According to another aspect, a multi-phase clock signal generating circuit comprise a phase clock generating block configured to produce a plurality of multi-phase clock signals, which are out of phase with each other, in response to a pair of clock signals which are out of phase with each other, a phase correction block configured to produce a plurality of interpolated phase clock signal groups by repeatedly producing interpolated phase clock signals each of which has a center phase between adjacent clock signals of the plurality of multi-phase clock signals, and a clock control block configured to produce output multi-clock signals by selectively outputting one of the interpolated phase clock signal groups using a digital control signal having a plurality of bits and a plurality of enable signals which are produced in response to a phase difference between adjacent clock signals of the multi-phase clock signals, wherein the plurality of enable signals determine a repeated number of the interpolation of the multi-phase clock signals.

According to further another aspect, a multi-phase clock signal generating circuit comprises a phase correction block control unit configured to produce a plurality of enable signals and a digital control signal having a plurality of bits in response to a phase difference between adjacent phase clock signals of multi-phase clock signals.

The multi-phase clock signals are out of phase with each other, a phase correction block configured to produce a plurality of interpolated phase clock signal groups by controlling a repeated number of interpolation of the multi-phase clock signals in response to the plurality of enable signal when the interpolated phase clock signals having a center phase between adjacent clock signals are repeatedly produced, and a clock output unit configured to selectively output one of the interpolated phase clock signal groups in response to the digital control signal having the plurality of bits.

According to still another aspect, a multi-phase clock signal generating circuit comprises a plurality of phase interpolation blocks configured to produce a plurality of interpolated phase clock signal groups each of which has a center phase between adjacent clock signals of multi-phase clock signals, being arranged in a multi-stage and in series coupled to each other, wherein the multi-phase clock signals are out of phase with each other, a plurality of transfer units configured to receive and transfer signals from the plurality of phase interpolation blocks, and a phase correction block control unit configured to produce a plurality of enable signals, which control an activation of the plurality of phase interpolation blocks, and a digital control signal having a plurality of bits, which control transmission in the plurality of transfer units, in response to a phase differences between the adjacent clock signals of the multi-phase clock signals, wherein the phase correction block control unit is configured to produce the plurality of enable signals to activate both the phase interpolation block, which is coupled to the transfer unit to receive an activated bit signal of the digital control signal, and all of the phase interpolation blocks in a pre-stage, when the digital control signal having the activated bit signal of the bits is provided.

According to still another aspect, a method for controlling a multi-phase clock signal generating circuit comprises the steps of producing a plurality of enable signals and a digital control signal having a plurality of bits based on a phase difference between adjacent clock signals of multi-phase clock signals which are out of phase with each other, providing a plurality of interpolated phase clock signal groups by repeatedly producing interpolated phase clock signals each of which has a center phase between adjacent clock signals of the multi-phase clock signals in response to the plurality of enable signals.

One of the interpolated phase clock signal groups is provided in response the digital control signal having the plurality of bit, as output multi-clock signals.

These and other features, aspects, and embodiments are described below in the section entitled "Detailed Description."

BRIEF DESCRIPTION OF THE DRAWINGS

The above and other aspects, features and other advantages of the subject matter of the present disclosure will be more clearly understood from the following detailed description taken in conjunction with the accompanying drawings, in which.

DETAILED DESCRIPTION

According to an embodiment of the present invention, at the time of generating multi-phase clock signals, the number of generation of the multi-phase clock signals is determined by providing enable signals based on a phase error of the clock signals and clock signals, which are interpolated within the determined number of the generation of the clock signals, are provided. Furthermore, according to an embodiment of the present invention, signal paths of the phase interpolated signals can be controlled selectively by providing a digital control signal based on the phase error of the clock signals.

Figure 1:
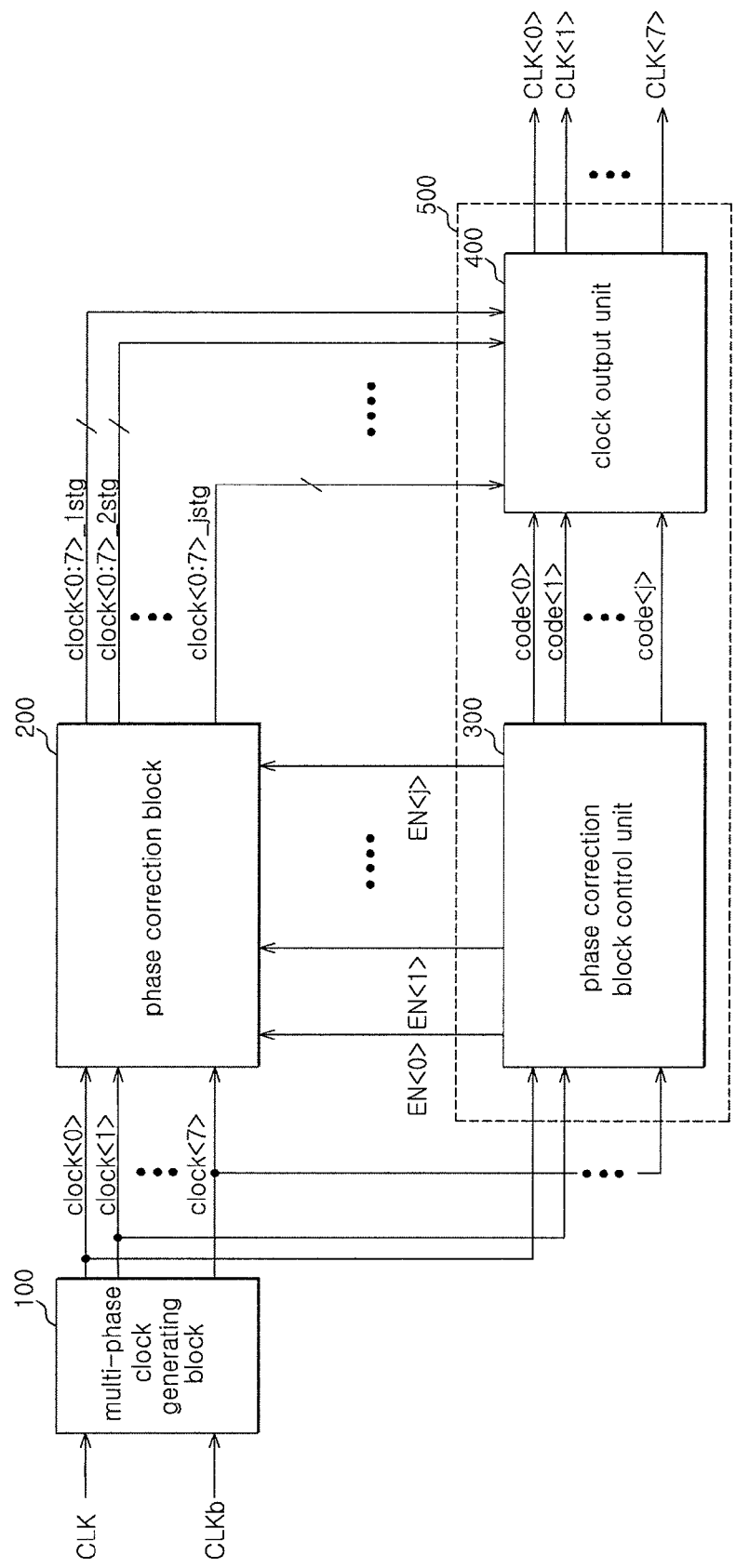
FIG. 1 is a block diagram showing an exemplary structure of a multi-phase clock generating circuit according an embodiment of the present invention.

FIG. 1 is a block diagram showing an example of a structure of a multi-phase clock generating circuit to generate 8-phase clock signals. It should be understood, that while FIG. 1 depicts a multi-phase clock generating circuit generating 8-phase clock signals, the present invention is not limited to the generation of 8-phase clock signals.

Referring to FIG. 1, according to an embodiment of the present invention the multi-phase clock generating circuit includes a multi-phase clock generating block 100, a phase correction block 200, and a clock control block 500.

First, the multi-phase clock generating block 100 provides a plurality of clock signals 'clock<0:7>' in response to a pair of clock signals (i.e., complementary signals) CLK and CLKb. The plurality of clock signals 'clock<0:7>' are out of phase with each other. That is, the multi-phase clock generating block 100 provides eight octal clock signals 'clock<0:7>', which are out of phase with each other and have a frequency that corresponds to one-eighth of the bandwidth of the pair of clock signals 'CLK' and 'CLKb'. According to an embodiment of the present invention, the multi-phase clock generating block 100 utilizes a general phase interpolator. For example, first, the multi-phase clock generating block 100 produces quadrature clock signals (not shown) having four different clock signals, i.e., 4-phase clock signals, based on the pair of clock signals 'CLK' and 'CLKb'. Second, after producing the quadrature clock signal, octal clock signals, i.e., 8-phase clock signals, are provided. However, it should be understood that the present disclosure is not limited to the number of phase clock signals being equal to eight. The phase signals can be modified and changed based on circuit configuration. However, it should be noted that according to an embodiment of the present invention the multi-phase clock signals produced as described above have a constant phase difference and a fractional frequency (1/n) of the bandwidth of the pair of clock signals CLK and CLKb.

Therefore, the first to eighth clock signal of the octal clock signals 'clock<0:7>' maintain a phase difference of n/4 (45°) to each other. That is, according to an embodiment of the present invention, the clock signals 'clock<0:7>' are configured to have the phases of 0°, 45°, 90°, 135°, 180°, 225°, 270°, and 315°, respectively. Hereinafter, the frequency of the octal clock signals 'clock<0:7>' will be illustrated at 1.25 GHz, that is, the frequency of the octal clock signals 'clock<0:7>' will be illustrated at tCK of 800 ps and at 1 UI (Unit Interval) of 100 ps.

According to an embodiment of the present invention, the phase correction block 200 produces a plurality of one interpolated phase clock signal groups 'clock<0:7>_1stg' to 'clock<0:7>_jstg' by repeatedly producing interpolated phase clock signals having a center phase between the adjacent clock signals (e.g., between clock<0> and clock<1>) among the octal clock signals 'clock<0:7>'. In more detail, the phase correction block 200 receives the octal clock signals 'clock<0:7>' and produces center-phase clock signals (i.e., the interpolated phase clock signal groups 'clock<0:7>_1stg' to 'clock<0:7>_jstg') using phase interpolation. Through this, the phase correction block 200 reduces a phase error for the octal clock signals 'clock<0:7>'. The phase correction block 200 is controlled by a plurality of enable signals 'EN<0:j>' for determining the number of the interpolation. This will be described in detail below.

The clock control block 500 produces digital control signals 'code<0:j>' having a plurality of bits and the enable signals 'EN<0:j>' according to the octal clock signals 'clock<0:7>', and the clock control block 500 selectively outputs one of the interpolated phase clock signal groups 'clock<0:7>_1stg' to 'clock<0:7>_jstg' to produce output multi-clock signals 'CLK<0:7>'. As shown in FIG. 1, the clock control block 500 can include a phase correction block control unit 300 and a clock output unit 400.

In more detail, the phase correction block control unit 300 produces the digital control signals 'code<0:j>', in which only one of the plurality of bits is activated and the remaining bits are not activated, in response to a phase difference between adjacent clock signals among the octal clock signals 'clock<0:7>'. Furthermore, according to an embodiment of present invention, the phase correction block control unit 300 determines the number of phase interpolation for the phase correction block 200 by providing the plurality of enable signals 'EN<0:j>' to the phase correction block 200. The plurality of enable signals 'EN<0:j>' are selectively activated in order to correspond to these digital control signals 'code<0:j>'. According to an embodiment of the present invention, the clock output unit 400 receives the interpolated phase clock signal groups 'clock<0:7>_jstg' to and 'clock<0:7>_jstg', and one among the interpolated phase clock signal groups 'clock<0:7>__1stg' to 'clock<0:7>_jstg' is selected in response to the digital control signals 'code<0:j>' having a plurality of bits.

Figure 2:
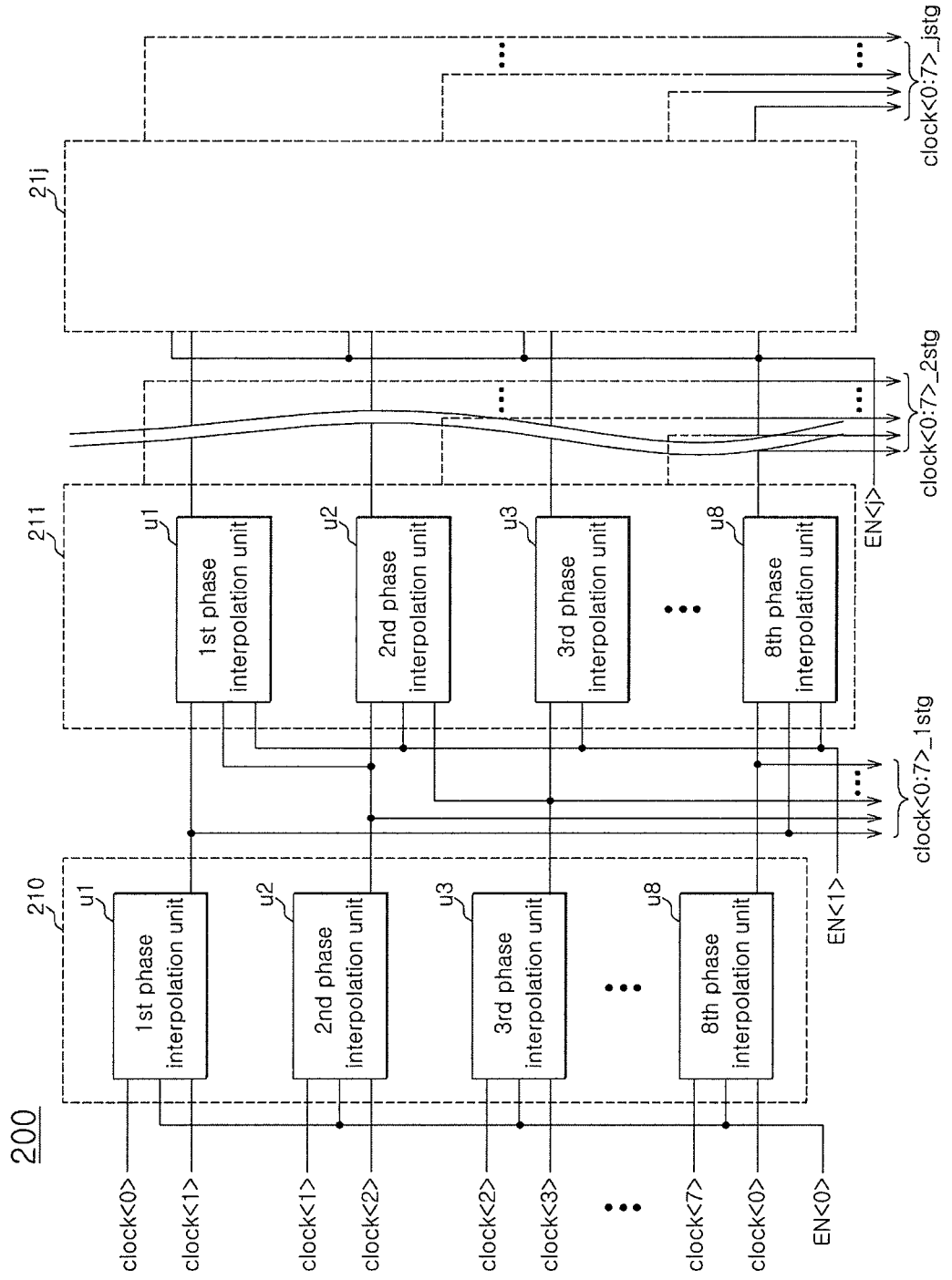
FIG. 2 is a block diagram showing an exemplary structure of a phase correction block shown in FIG. 1.

FIG. 2 is a block diagram showing an example of a structure of the phase correction block 200 in FIG. 1.

As shown in FIG. 2, the phase correction block 200 can include a plurality of phase interpolation blocks 210 to 21j, and the phase interpolation blocks 210 to 21j can be coupled to each other in series. The number of the phase interpolation blocks 210 to 21j determine a degree to which a phase error can be corrected.

Each of the phase interpolation blocks 210 to 21j can include first to eighth phase interpolation units u1 to u8. Each of the first to eighth phase interpolation units u1 to u8 produces an interpolated clock signal using adjacent clock signals. For the sake of convenience in illustration, only the first phase interpolation block 210 will be described below. Also, for the sake of convenience in illustration, the eight phase clock signals of 0°, 45°, 90°, 135°, 180°, 225°, 270° and 315° are designated as first to eighth octal clock signals 'clock<0>' to 'clock<7>', respectively.

First, the first phase interpolation block 210 produces a first interpolated phase clock signal group 'clock<0:7>__1stg' in response to an activation of the first enable signal 'EN<0>'. The first phase interpolation unit u1 of the first phase interpolation block 210 produces a phase-interpolated clock signal between the adjacent first and second octal clock signals 'clock<0>', 'clock<1>'. The remaining phase interpolation units operate in substantially the same regard, that is, the second phase interpolation unit u2 produces a phase interpolated clock signal between the adjacent second and third octal clock signals 'clock<1>', 'clock<2>'. Likewise, each of the third to eighth phase interpolation units u3 to u8 produces a phase-interpolated clock signal between two adjacent octal clock signals. Therefore, the first phase interpolation block 210 produces the first interpolated phase clock signal group 'clock<0:7>__1stg' which is interpolated according to the first to eighth octal clock signals 'clock<0>' to 'clock<7>'. It follows that the other phase interpolation blocks 211 to 21j, which coupled to each other in series, function in a similar regard and respectively produce the second to j-th interpolated phase clock signal groups 'clock<0:7>__2stg' to 'clock<0:7>_jstg' in response to the activation of the enable signals 'EN<1:j>' by producing phase-interpolated clock signals between two adjacent octal clock signals from the pre-stages.

Typically, since a high-frequency clock signal exhibits characteristics of frequency dependency, a clock skew may occur for every clock signals and therefore it is difficult to maintain a constant phase gap in the multi-phase clock signals having the clock skew.

However, according to an embodiment of the present invention, the interpolation clock signals are produced at the predetermined number based on the phase error of the first to eighth octal clock signals 'clock<0>' to 'clock<7>' using the phase correction block 200.

When clock signals are produced by the phase interpolation method, the phases of the clock signals are continuously adjusted. That is, whenever new clock signals are produced by the phase interpolation method, the phase error is reduced to a half range of the skew. Accordingly, the range of the phase error between the first to eighth octal clock signals 'clock<0>' to 'clock<7>' can be reduced by including a plurality of phase interpolation blocks in the phase correction block 200.

Particularly, according to an embodiment of the present disclosure, the plurality of phase interpolation blocks are configured to be driven selectively. For example, when the first enable signal 'EN<0>' and the second enable signal 'EN<1>' are activated, only the first and second phase interpolation blocks 210, 211 are driven. Accordingly, when the first and second enable signals 'EN<0>' and 'EN<1>' are activated, the phase correction block 200 produces the first and second interpolated phase clock signal groups 'clock<0:7>__1stg' and 'clock<0:7>__2stg'. In this case, the phase error of the second interpolated phase clock signal group 'clock<0:7>__2stg' is less than that of the first interpolated phase clock signal group 'clock<0:7>__1stg'.

That is, the phase error range is reduced whenever the clock signals pass through the phase interpolation blocks 210 to 21j. Further, the number of the phase interpolation blocks 210 to 21j that are driven can be adjusted based on the phase error of the first to eighth octal clock signals 'clock<0>' to 'clock<7>'. Therefore, according to an embodiment of the present invention, the phase interpolation blocks 210 to 21j are selectively driven according to the phase error of the clock signals, and as a result, current consumption can be reduced.

Here, the phase correction block 200 does not produce the phase clock signals, but the phase correction block 200 interpolates the phases of the clock signals. That is, the phase correction block 200 is configured to produce the clock signals having a center phase between the adjacent clock signals.

Figure 3:
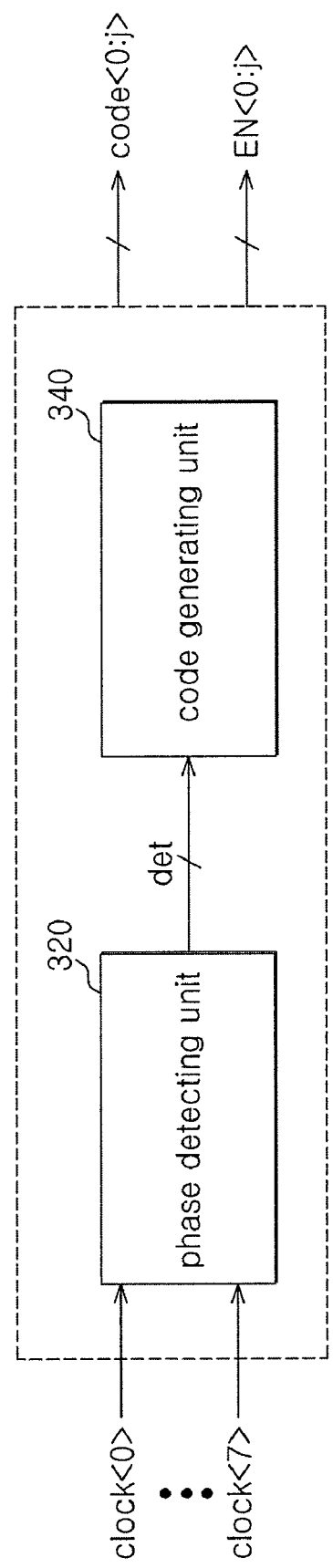
FIG. 3 is a block diagram showing an exemplary structure of a phase correction block control unit shown in FIG. 1.

FIG. 3 is a block diagram showing an example of a structure of the phase correction block control unit 300 shown in FIG. 1.

Referring to FIG. 3, the phase correction block control unit 300 can include a phase detecting unit 320 and a code generating unit 340.

The phase detecting unit 320 is configured to detect a phase difference between adjacent clock signals of the plurality of octal clock signals 'clock<0:7>' so as to produce a detection signal 'det'. The phase detecting unit 320 can be implemented, for example, by a general phase comparator or a phase detector. Accordingly, the phase detecting unit 320 may include a plurality of phase comparators (not shown) configured to detect a phase difference between adjacent clock signals. The operation of the phase comparator is well known to those skilled in the art and as such will be not illustrated in detail. Each of the phase comparators (not shown) in the phase detecting unit 320 detects phase differences between the adjacent clock signals and outputs an analog voltage signal of a high or low level as the detection signal 'det'. For example, a plurality of flip-flops can be provided to compare the phase of the first octal clock signal 'clock<0>' with the phase the second octal clock signal 'clock<1>', the phase of the third octal clock signal 'clock<2>' with the phase the fourth octal clock signal 'clock<3>', the phase of the fifth octal clock signal 'clock<4>' with the phase the sixth octal clock signal 'clock<5>', and the phase of the seventh octal clock signal 'clock<6>' with the phase the eighth octal clock signal 'clock<7>'. In this case, a rising edge of the first octal clock signal 'clock<0>' can be detected at a rising edge of the second octal clock signal 'clock<1>' and a rising edge of the third octal clock signal 'clock<2>' can be detected at a rising edge of the fourth octal clock signal 'clock<3>'.

The code generating unit 340, receives the detection signal 'det' outputted by the phase detecting unit 320 and outputs the plurality of digital control signals 'code<0:j>' and the plurality of enable signals 'EN<0:j>'. For example, the code generating unit 340 can be a demultiplexer (DeMux) for outputting a plurality of output signals using one input signal. The code generating unit 340 can provide the digital control signals 'code<0:j>', in which only one bit is activated, according to the number of high levels of the detection signal 'det' and also provide the enable signals 'EN<0:j>' to be preset in such a manner that the enable signals 'EN<0:j>' corresponds to the digital control signals 'code<0:j>', of which only one bit is activated.

In more detail, when the phase difference of the octal clock signals 'clock<0:7>' cannot be maintained at a constant value there is an error in the mutual phase relationship between the clock signals due to the presence of jitter or skew. When the phase difference of the octal clock signals 'clock<0:7>' is maintained at a constant value, the detection signal 'det' can be set to, for example, "LLLH". However, there a detection signal 'det' of "LLHH" can be generated, which is different from the pre-set value "LLLH", due to the phase error among the octal clock signals 'clock<0:7>'.

In this case, since the phase correction has to be carried out, the code generating unit 340 provides the digital control signals 'code<0:j>' of four bits, i.e., "LHLL" signal, assuming that it provides a four-bit signal. Furthermore, the first to third enable signals 'EN<0:2>' of the enable signals 'EN<0:j>' can be activated in a high level and the fourth enable signal 'EN<4>' can be deactivated in a low level.

In other words, the detection signal 'det', which is increased in the number of high level, is provided according to the phase error between the octal clock signals 'clock<0:7>' and then the phase interpolation blocks shown in FIG. 2 are driven more to correct the phase error. Therefore, the code generating unit 340 counts the number of high level bits of the detection signal 'det' and then outputs the digital control signals 'code<0:j>' in which one of the plurality of bits is activated in a high level.

At this time, the code generating unit 340 provides the digital control signals 'code<0:j>' according to the number of high levels of the detection signal 'det' in such a manner that an activated bit to a high level is moved to an upper bit level. For example, assuming that the code generating unit 340 provides the digital control signals 'code<0:j>' of "HLLL" and the enable signals 'EN<0:j>' of "HLLL" when the detection signal 'det' is "LLLH", the digital control signals 'code<0:j>' of "LLHL" and the enable signals 'EN<0:j>' of "HHHL" are provided when the detection signal 'det' is changed into "LHHH".

The relationship between the detection signal 'det' and the enable signals 'EN<0:j>' will be described in detail with reference to FIG. 2. When the detection signal 'det' is "LHHH" based on a phase error between the octal clock signals 'clock<0:7>', the phase correction block 200 receives the enable signals 'EN<0:j>' of "HHHL" and drives the first to third phase interpolation blocks (210, 211 . . . ) thereby carrying out the phase interpolation three times. That is, the greater the phase error of the octal clock signals 'clock<0:7>', the greater the increase in the number of the phase interpolation by the enable signals 'EN<0:j>'.

Figure 4:
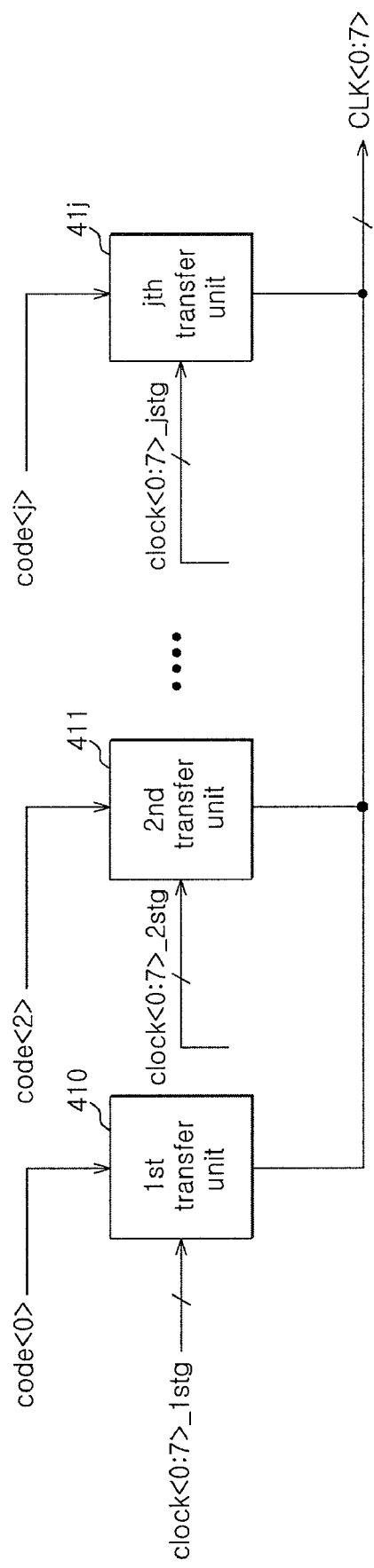
FIG. 4 is a block diagram showing an exemplary structure of a clock output unit shown in FIG. 1.

FIG. 4 is a block diagram showing an example of a structure of the clock output unit 400 in FIG. 1.

Referring to FIG. 4, the clock output unit 400 can include first to $j^{th}$ transfer units 410 to 41j, each of which is controlled in response to one bit of the digital control signals 'code<0:j>', and each receiving a corresponding one of the interpolated phase clock signal groups 'clock<0:7>_1stg' to 'clock<0:7>_jstg', respectively.

Accordingly, although the clock output unit 400 receives the plurality of interpolated phase clock signal groups 'clock<0:7>_1stg' to 'clock<0:7>jstg' from the phase correction block 200 shown in FIG. 2, only one of the interpolated phase clock signal groups 'clock<0:7>_1stg' to 'clock<0:7>_jstg' can be output by one of the transfer units 410 to 41j, which are controlled in response to the one activated bit of the digital control signals 'code<0:j>'.

The relationship between the digital control signals 'code<0:j>' and the enable signals 'EN<0:j>' will now be summarized. The plurality of digital control signals 'code<0:j>', in which only one bit is activated based on the phase error, are provided by the phase correction block control unit 300 and the enable signals 'EN<0:j>' are provided by the phase correction block control unit 300 to activate all the phase interpolation blocks including both the blocks connected to the transfer units 410 to 41j so as to receive the corresponding activation bit, and the blocks at the pre-stages.

As mentioned above, according to an embodiment present of the present invention, the enable signals 'EN<0:j>', which determines the number of the phase interpolation steps based on the phase error of the octal clock signal 'clock<0:7>', are provided. Therefore, the interpolated phase clock signal groups 'clock<0:7>_1stg' to 'clock<0:7>_jstg', which are phase interpolated within the determined number of the phase interpolation steps, are selectively output as the output multi-clock signals 'CLK<0:7>' in response to the digital control signals 'code<0:j>'.

Figure 5:
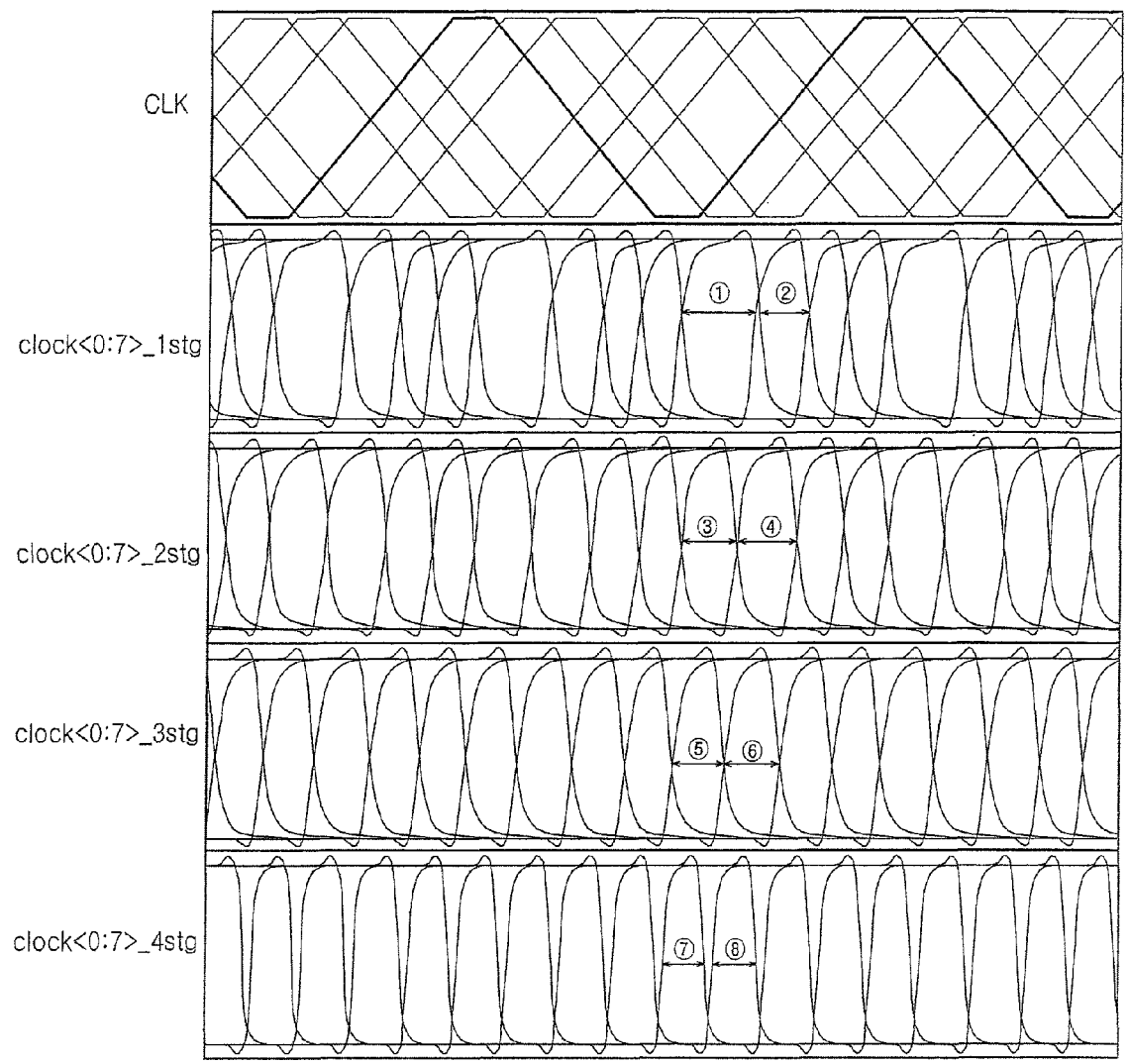
FIG. 5 is a voltage waveform shown for illustrating the relationship between the clock signals shown in FIG. 2.

FIG. 5 is a voltage waveform shown for illustrating the relationship between clock signals in FIG. 2.

Referring to FIG. 5, the phase interpolation is carried out four times because a large phase error is present. The clock signals outputted from the phase interpolation blocks 210 to 21j are shown.

As shown in FIG. 5, phase errors (①and ②) are generated among the first interpolated phase clock signal group 'clock<0:7>_1stg' output by the first phase interpolation block 210 in FIG. 2. That is, the phase errors (①and ②) among the first interpolated phase clock signal group 'clock<0:7>_1stg' do not have a constant error as ①is wider than ②.

Phase errors (③and ④) are generated among the second interpolated phase clock signal group 'clock<0:7>_2stg' output by the second phase interpolation block 211 in FIG. 2. That is, the phase errors ③and ④among the second interpolated phase clock signal group 'clock<0:7>_2stg' do not have a constant error as ③is wider than ④.

Similarly, phase errors ⑤and ⑥are generated among the third interpolated phase clock signal group 'clock<0:7>_3stg' output by the third phase interpolation block. That is, the phase errors ⑤and ⑥among the third interpolated phase clock signal group 'clock<0:7>_3stg' do not have a constant error as ⑤is wider than ⑥. However, as is shown in FIG. 5, as the number of the phase interpolation (i.e., the number of phase interpolation stages) is increased, the amount of the phase error is decreased.

The fourth interpolated phase clock signal group 'clock<0:7>_4stg' has a constant phase difference as ⑦and ⑧are shown to be equal, as such the fourth interpolated phase clock signal group 'clock<0:7>_4stg' is selected as the final output clock signals.

As apparent from the above, at the time of generating the multi-phase clock signals, the enable signals are generated based on the phase error of the clock signals, the number of clock generation steps or stages is determined in the multi-phase clock signals, and then the interpolated phase clock signals are provided, within the determined number of clock generation steps, with the correction of the phase error. Furthermore, since the phase interpolation blocks are selectively driven by the digital control signal based on the phase error of the clock signals, current consumption can be reduced.

The phase error amount of the clock signals can be corrected by generating the corrected multi-phase clock signals, having a center phase between the input clock signals, and using the phase error information between the input clock signals as described above. Furthermore, the data quality and transmission rate are be improved by using the corrected multi-phase clock signals of the present invention.

While certain embodiments have been described above, it will be understood that the embodiments described are by way of example only. Accordingly, the systems and methods described herein should not be limited based on the described embodiments. Rather, the systems and methods described herein should only be limited in light of the claims that follow when taken in conjunction with the above description and accompanying drawings.

What is claimed is:

1. A multi-phase clock signal generating circuit comprising:
    a phase correction block configured to receive multi-phase clock signals, the multi-phase clock signals being out of phase with each other, and to produce a plurality of interpolated phase clock signal groups in which the phases of the multi-phase clock signals are differently controlled; and
    a clock control block configured to produce output multi-clock signals by selectively outputting one of the interpolated phase clock signal groups using a digital control signal having a plurality of bits, the bits being produced according to phase differences of the multi-phase clock signals.

2. The multi-phase clock signal generating circuit of claim 1, wherein the phase correction block comprises a plurality of phase interpolation blocks each of which produces a signal having a center phase between adjacent clock signals input thereto.

3. The multi-phase clock signal generating circuit of claim 1, wherein the clock control block comprises:
    a phase detection unit configured to detect a phase difference between adjacent clock signals among the multi-phase clock signals and produce a detection signal; and
    a code generating unit configured to produce the digital control signal having the plurality bits in response to the detection signal.

4. A multi-phase clock signal generating circuit comprising:
    a phase clock generating block configured to produce a plurality of multi-phase clock signals in response to a pair of clock signals that are out of phase with each other, wherein the multi-phase signals of the plurality of multi-phase signals are out of phase with each other;
    a phase correction block configured to produce a plurality of interpolated phase clock signal groups by producing interpolated phase clock signals each having a center phase between adjacent clock signals of the plurality of multi-phase clock signals; and
    a clock control block configured to produce output multi-clock signals by selectively outputting one of the interpolated phase clock signal groups according to a digital control signal having a plurality of bits and configured to produce a plurality of enable signals in response to a phase difference between adjacent clock signals among the multi-phase clock signals,
    wherein a number of the interpolation of the multi-phase clock signals is determined according to the plurality of enable signals.

5. The multi-phase clock signal generating circuit of claim 4, wherein the phase correction block comprises a plurality of phase interpolation units each of which receives adjacent signals among the plurality of multi-phase clock signals and produces a signal having a center phase between the adjacent clock signals.

6. The multi-phase clock signal generating circuit of claim 4, wherein the clock control block comprises:
    a phase correction block control unit configured to produce the enable signals and the digital control signal having the plurality of bits according to phase differences among the multi-phase clock signals; and
    a clock output unit configured to selectively output one of the interpolated phase clock signal groups according to the digital control signal having the plurality of bits.

7. The multi-phase clock signal generating circuit of claim 6, wherein the phase correction block control unit comprises:
    a phase detection unit configured to detect a phase difference between adjacent clock signals among the plurality of multi-phase signals and produce a detection signal; and
    a code generating unit configured to produce the enable signals and the digital control signal having the plurality of bits in response to the detection signal.

8. The multi-phase clock signal generating circuit of claim 6, wherein the clock output unit comprises a plurality of transfer units each driven respectively by the bits of the digital control signal.

9. A multi-phase clock signal generating circuit comprising:
    a phase correction block control unit configured to produce a plurality of enable signals and a digital control signal having a plurality of bits in response to a phase difference between adjacent phase clock signals among a plurality of multi-phase clock signals, wherein the multi-phase clock signals among the plurality of multi-phase clock signals are out of phase with each other;
    a phase correction block configured to produce a plurality of interpolated phase clock signal groups by controlling a number of interpolations of the multi-phase clock signals in response to the plurality of enable signal when the interpolated phase clock signals having a center phase between adjacent clock signals among the plurality of multi-phase clock signals are produced repeatedly; and
    a clock output unit configured to selectively output one of the interpolated phase clock signal groups according to the digital control signal having the plurality of bits.

10. The multi-phase clock signal generating circuit of claim 9, wherein the phase correction block control unit comprises:
    a phase detection unit configured to detect a phase difference between the adjacent clock signals among the plurality of multi-phase clock signals and produce a detection signal; and
    a code generating unit configured to produce the enable signals and the digital control signal having the plurality of bits in according to the detection signal.

11. The multi-phase clock signal generating circuit of claim 9, wherein the phase correction block comprises a plurality of phase interpolation units each producing a signal having the center phase between the adjacent clock signals.

12. The multi-phase clock signal generating circuit of claim 9, wherein the clock output unit comprises a plurality of transfer units each driven respectively by the bits of the digital control signal.

13. A multi-phase clock signal generating circuit comprising:
    a plurality of phase interpolation blocks configured to produce a plurality of interpolated phase clock signal groups, each of which has a center phase between adjacent clock signals of multi-phase clock signals, the plurality of phase interpolation blocks being configured in multiples stages, the stages being coupled in series to each other, wherein the multi-phase clock signals are out of phase with each other;

a plurality of transfer units configured to receive and transfer signals from the plurality of phase interpolation blocks; and a phase correction block control unit configured to produce a plurality of enable signals, for controlling activation of the plurality of phase interpolation blocks, and a digital control signal having a plurality of bits for controlling transmission in the plurality of transfer units in response to phase differences between the adjacent clock signals of the multi-phase clock signals, wherein the phase correction block control unit is configured to produce the plurality of enable signals to activate both the phase interpolation block coupled to the transfer unit to receive an activated bit signal of the digital control signal and activate each of the phase interpolation blocks in a pre-stage when the digital control signal having the activated bit signal of the plurality of bits is provided.

14. The multi-phase clock signal generating circuit of claim 13, wherein the phase correction block control unit comprises:

a phase detection unit configured to detect a phase difference between the adjacent clock signals and produce a detection signal; and a code generating unit configured to produce the enable signals and the digital control signal having the plurality of bits in response to the detection signal.

15. A method for controlling a multi-phase clock signal generating circuit comprising:

producing a plurality of enable signals and a digital control signal having a plurality of bits according to a phase difference between adjacent clock signals among a plurality of multi-phase clock signals, the multi-phase clock signals being out of phase with each other;

providing a plurality of interpolated phase clock signal groups by repeatedly producing interpolated phase clock signals each of which has a center phase between adjacent clock signals of the multi-phase clock signals in response to the plurality of enable signals; and providing one among the plurality of interpolated phase clock signal groups in response the digital control signal having the plurality of bits as output multi-clock signals.

16. The multi-phase clock signal generating circuit of claim 15, wherein the producing of the plurality of enable signals and the digital control signal comprises:

producing a detection signal by detecting a phase difference between the adjacent clock signals of the multi-phase clock signals; and producing the digital control signal having the plurality of bits and the plurality of enable signals in response to the detection signal.

17. The multi-phase clock signal generating circuit of claim 15, wherein the providing of the output multi-clock signals comprises selectively outputting one among the interpolated phase clock signal groups by providing the digital control signal of which one bit is activated.

\* \* \* \* \*